United States Patent
Tsutsui et al.

(10) Patent No.: US 7,735,055 B2
(45) Date of Patent: Jun. 8, 2010

(54) METHOD OF CREATING PHOTO MASK DATA, METHOD OF PHOTO MASK MANUFACTURING, AND METHOD OF MANUFACTURING SEMICONDUCTOR DEVICE

(75) Inventors: Tomohiro Tsutsui, Kawasaki (JP); Osamu Ikenaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1015 days.

(21) Appl. No.: 11/187,003

(22) Filed: Jul. 22, 2005

(65) Prior Publication Data

US 2006/0292458 A1    Dec. 28, 2006

(30) Foreign Application Priority Data

Jul. 23, 2004   (JP) .............................. 2004-216374

(51) Int. Cl.
  G06F 17/50   (2006.01)
  G06F 19/00   (2006.01)
  G03F 1/00    (2006.01)
  G21K 5/00    (2006.01)
(52) U.S. Cl. ...................... 716/21; 700/97; 700/108; 700/120; 700/121; 430/5; 378/35
(58) Field of Classification Search ................ 716/21; 700/97, 108, 120, 121; 430/5; 378/35
  See application file for complete search history.

(56) References Cited

U.S. PATENT DOCUMENTS

| | | | | |
|---|---|---|---|---|
| 6,401,235 B1 * | 6/2002 | Ashida | ......................... | 716/19 |
| 6,413,688 B2 | 7/2002 | Akutagawa et al. | | |
| 6,477,700 B1 * | 11/2002 | Yokota | ......................... | 716/21 |
| 6,562,525 B2 * | 5/2003 | Mori | .............................. | 430/5 |
| 6,846,597 B2 * | 1/2005 | Narukawa et al. | ............... | 430/5 |
| 6,999,835 B2 * | 2/2006 | Kodama | ...................... | 700/121 |
| 7,027,143 B1 * | 4/2006 | Stokowski et al. | ........ | 356/237.2 |
| 7,035,449 B2 * | 4/2006 | Hung et al. | ..................... | 430/5 |
| 7,037,627 B2 * | 5/2006 | Aoki et al. | ...................... | 430/5 |
| 7,123,356 B1 * | 10/2006 | Stokowski et al. | ........ | 356/237.2 |
| 7,231,628 B2 * | 6/2007 | Pack et al. | ..................... | 716/19 |
| 7,243,331 B2 * | 7/2007 | Bartov | .......................... | 716/19 |

(Continued)

FOREIGN PATENT DOCUMENTS

JP   08-087101   4/1996

(Continued)

OTHER PUBLICATIONS

Office Action dated Nov. 17, 2009 from the Japanese Patent Office for related Japanese Application No. 2004-238535.

(Continued)

*Primary Examiner*—Phallaka Kik
(74) *Attorney, Agent, or Firm*—Finnegan, Henderson, Farabow, Garrett & Dunner, L.L.P.

(57) ABSTRACT

A method of creating photo mask data includes preparing design data of a photo mask, generating drawing data of the photo mask by using the design data, generating inspection control information configured to control inspection of defect on the photo mask by using the drawing data, and generating drawing and inspection data including the drawing data and the inspection control information by providing the drawing data with the inspection control information.

4 Claims, 10 Drawing Sheets

U.S. PATENT DOCUMENTS

| | | |
|---|---|---|
| 7,254,263 B2 * | 8/2007 | Ine .............................. 382/145 |
| 7,646,906 B2 * | 1/2010 | Saidin et al. ................ 382/144 |
| 2002/0076623 A1 * | 6/2002 | Mori .............................. 430/5 |
| 2002/0102473 A1 * | 8/2002 | Tange et al. .................... 430/5 |
| 2003/0073010 A1 * | 4/2003 | Narukawa et al. .............. 430/5 |
| 2004/0086791 A1 * | 5/2004 | Aoki et al. ..................... 430/5 |
| 2004/0115541 A1 | 6/2004 | Yamaguchi et al. |
| 2004/0133369 A1 * | 7/2004 | Pack et al. .................... 702/59 |
| 2005/0166171 A1 * | 7/2005 | Bartov ......................... 716/19 |
| 2006/0007433 A1 * | 1/2006 | Ikuta et al. .............. 356/237.2 |
| 2006/0236294 A1 * | 10/2006 | Saidin et al. .................. 716/19 |
| 2007/0178387 A1 * | 8/2007 | Ishida et al. .................... 430/5 |

FOREIGN PATENT DOCUMENTS

| | | |
|---|---|---|
| JP | 11-231507 | 8/1999 |
| JP | 2000146857 A * | 5/2000 |
| JP | 2001-330941 | 11/2001 |
| JP | 2002-023345 | 1/2002 |
| JP | 2003-057801 | 2/2003 |
| JP | 2004-20760 | 1/2004 |
| JP | 2004-191957 | 7/2004 |

OTHER PUBLICATIONS

Notice of Reasons for Rejection mailed Nov. 24, 2009, in corresponding Japanese Patent Application No. 2004-216374 and English-language translation thereof.

Notice of Reasons for Rejection mailed Feb. 16, 2010, from the Japanese Patent Office in corresponding Japanese application No. 2004-216374.

* cited by examiner

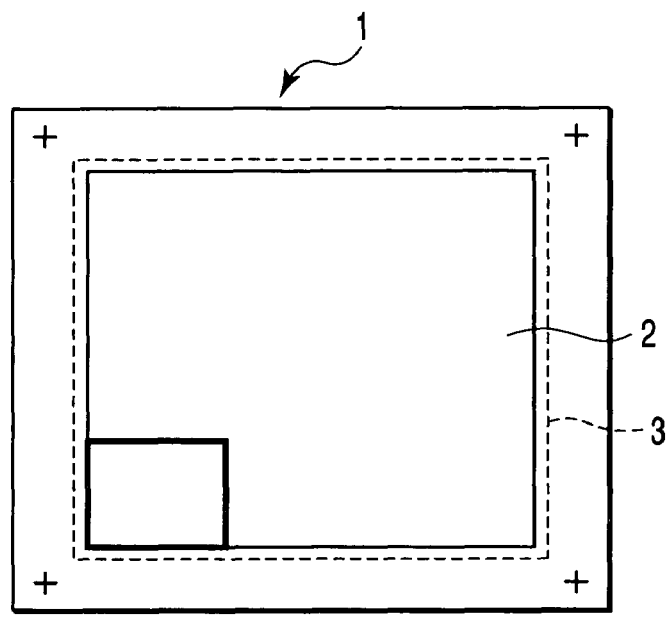
F I G. 3
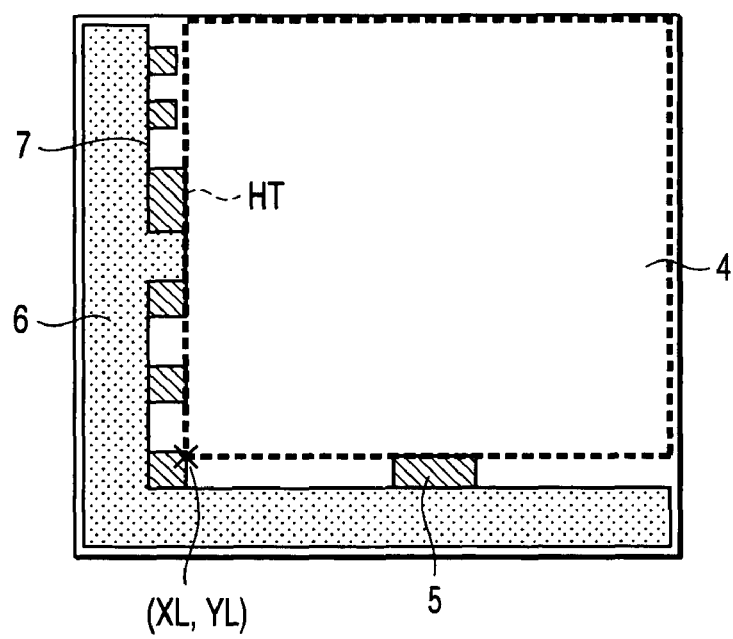
F I G. 4

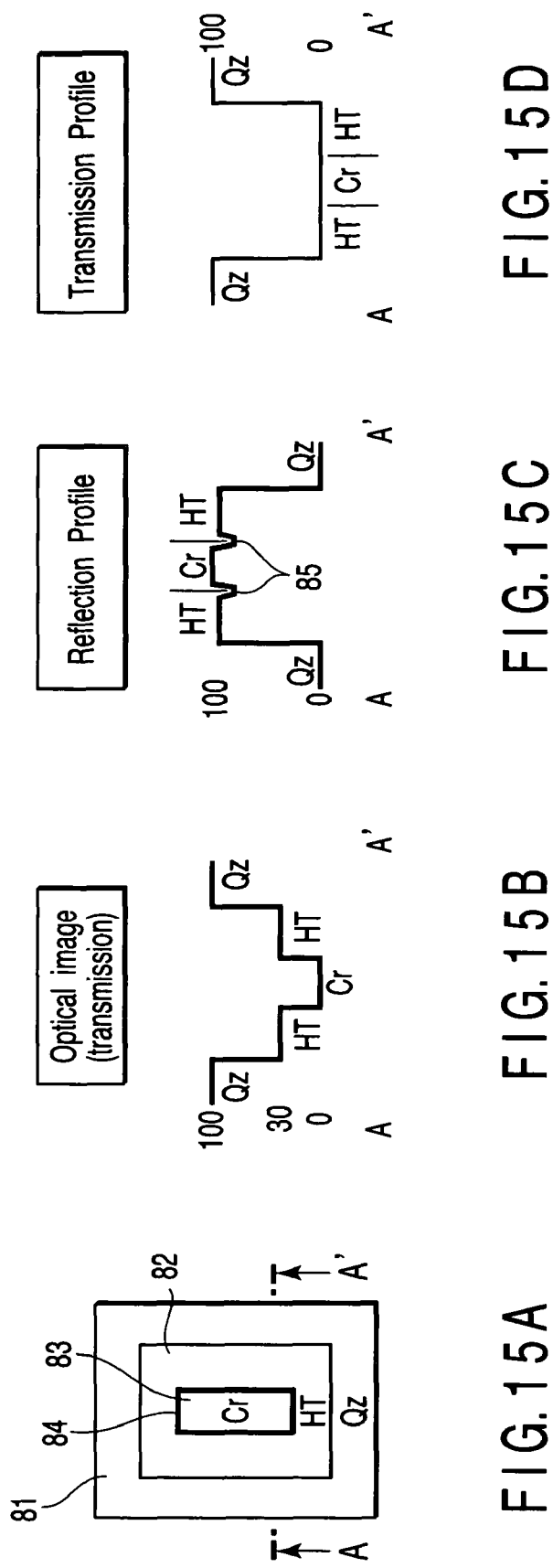

METHOD OF CREATING PHOTO MASK DATA, METHOD OF PHOTO MASK MANUFACTURING, AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-216374, filed Jul. 23, 2004, the entire contents of which are incorporated herein by reference.

BACKGROUND OF THE INVENTION

1. Field of the Invention

The present invention relates to a method of creating photo mask data for use in manufacture of a photo mask, a method of manufacturing a photo mask, including a manufacturing and inspecting a photo mask by using the photo mask data, and a method of manufacturing a semiconductor device.

2. Description of the Related Art

Along with reduction of size of semiconductor devices, a pattern of a photo mask used for manufacturing a semiconductor devices is becoming finer and finer. As the pattern becomes finer, it is more difficult to detect small defects formed on the photo mask correctly.

As one of apparatus for inspecting shape defects on a photo mask, shape defect inspection of a die-to-database comparison system is known (Jpn. Pat. Appln. KOKAI Publication No. 8-87101). One of causes of decline of precision inspection of this shape defect inspection is false detection of a normal fine pattern as defect. Such defect is called false defect.

If a number of false defects are detected, inspection is stopped. When inspection stops, it is attempted to suppress detection of false defects. Specifically, the inspection sensitivity is adjusted or the inspection sensitivity is lowered. However, if the inspection sensitivity is changed, inspection of high precision is not expected.

As the pattern becomes further finer, it is more difficult to finish the fine pattern in a desired pattern shape on the wafer. The reason is that pattern distortion or line width dimension variation due to optical proximity effect cannot be ignored.

To prevent pattern distortion or line width dimension variation due to optical proximity effect, a technology known as optical proximity correction (OPC) is needed. In the existing defect inspection apparatus, however, it is hard to inspect a photo mask including a fine pattern such as an OPC pattern.

In shape defect inspection for a high precision mask, reflection type inspection is attempted for the purpose of enhancing the inspection sensitivity in addition to conventional transmission type inspection.

In the case of reflection type inspection on a halftone (HT) mask, a data image of a pattern (a mask data image) formed on a photo mask is generated on the basis of intensity of two lights, that is, light reflected from a glass portion of the photo mask, and light reflected from a HT film. The mask data image and the inspection data image are compared with each other, and it is detected as defect formed on the photo mask where the difference of two images exceeds a specified value.

The HT mask has a region whose transmissivity changes in three steps (three-gradation region). The three-gradation region includes a tritone portion including a glass portion, a HT film portion, and a light shielding film portion. The three-gradation region is locally present in peripheral parts of an inspection region or the like. The HT mask further includes a boundary between the three-gradation region and the light shielding film portion.

An example of a pattern including such a boundary between the three-gradation region and the light shielding film portion is shown in FIG. 15A. In FIG. 15A, reference numeral 81 is a quartz substrate (Qz), 82 is a halftone film (HT) formed on a region in part of the quartz substrate 81, 83 is a Cr film as a light shielding film formed on a region in part of the halftone film 82, and 84 is a boundary between the three-gradation region and the light shielding film.

The transmissivity of the halftone film 82 is 30%, for example, when a light source is ArF. FIG. 15B shows an optical image (transmission) in arrow view A-A in FIG. 15A.

The boundary 84 between the three-gradation region and the light shielding film is detected as noise 85 as indicated by a reflection profile in FIG. 15C in reflection type inspection under an ordinary inspection condition.

In transmission type inspection, the boundary 84 between the three-gradation region and the light shielding film is not detected as noise as shown in FIG. 15D.

In reflection type inspection, since the boundary 84 between the three-gradation region and the light shielding film is detected as false defect, inspection may be stopped. To suppress detection of false defect, the inspection sensitivity must be lowered. However, when the inspection sensitivity is lowered, precise inspection is not expected, and inspection throughput is lowered.

In some masks, only a specific region of the entire mask is inspected. However, in such a case, an area to be inspected must be preliminarily specified by input of coordinates, which involves a risk of human error of input by an operator.

BRIEF SUMMARY OF THE INVENTION

According to an aspect of the present invention, there is provided a method of creating photo mask data comprising: preparing design data of a photo mask; generating drawing data of the photo mask by using the design data; generating inspection control information configured to control inspection of defect on the photo mask by using the drawing data; and generating drawing and inspection data including the drawing data and the inspection control information by providing the drawing data with the inspection control information.

According to an aspect of the present invention, there is provided a method of manufacturing a photo mask comprising: creating photo mask data including drawing and inspection data by a method of creating photo mask data according to an aspect of the present invention; forming a pattern including a light shielding pattern and a translucent pattern on a transparent substrate, on the basis of the drawing and inspection data; and inspecting the pattern on the basis of the drawing and inspection data.

According to an aspect of the present invention, there is provided a method of manufacturing a semiconductor device comprising: preparing a photo mask determined acceptable by a method of manufacturing a photo mask according to an aspect of the present invention; and manufacturing a semiconductor device by using the photo mask.

BRIEF DESCRIPTION OF THE SEVERAL VIEWS OF THE DRAWING

FIG. 3 is a plan view illustrating a photo mask according to the first embodiment of the invention;

FIG. 4 is a plan view illustrating a specific configuration of a part of a shape defect inspection region in the photo mask according to the first embodiment of the invention;

FIGS. 15A to 15D are diagrams for explaining problems due to presence of a three-gradation region.

DETAILED DESCRIPTION OF THE INVENTION

Now, embodiments of the present invention will be described below with reference to the accompanying drawings.

First Embodiment

Figure 1:
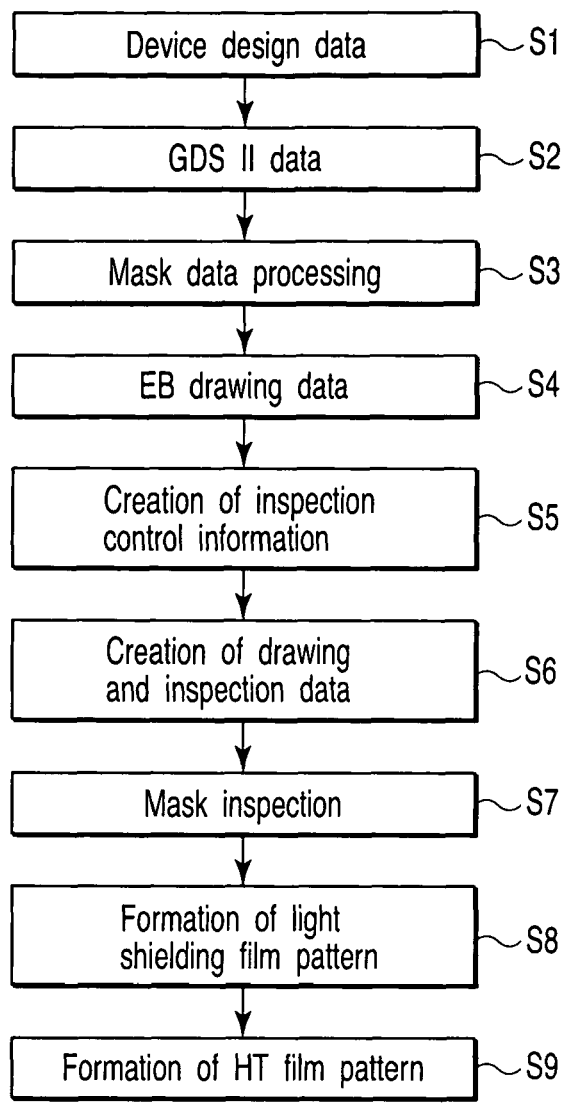
FIG. 1 is a flowchart showing a flow of a method of manufacturing a photo mask according to the first embodiment of the invention.

FIG. 1 is a flowchart showing a flow of a method of manufacturing a photo mask according to the first embodiment of the invention.

First, device design data of a photo mask is prepared (step S1). The device design data is created by a CAD tool.

Next, the device design data is converted into GDS II stream type data (GDS II data) (step S2). The device design data may be also converted into other data than the GDS II stream type data.

Next, mask data processing is applied to the GDS II data (step S3), and EB drawing data is created (step S4). The EB drawing data is stored in an external storage medium such as a magnetic tape or a magnetic disk.

Next, inspection control information is created by using the EB drawing data (step S5). The inspection control information is stored in the external storage medium or the like.

Figure 2:
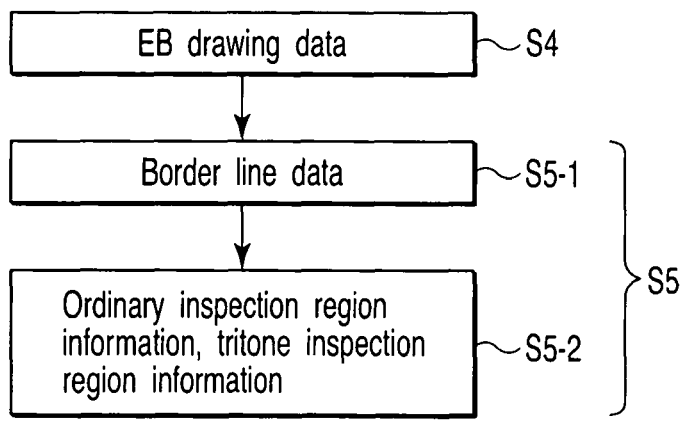
FIG. 2 is a flowchart showing contents of a step of creating inspection control information according to the first embodiment of the invention.

FIG. 2 is a flowchart showing contents of step S5.

For the sake of simplicity, herein, a part (a portion enclosed by thick line) of a shape defect inspection region 2 in a photo mask 1 shown in FIG. 3 will be specifically explained. The photo mask 1 includes a quartz substrate, a HT region, and a Cr light shielding region. In FIG. 3, reference numeral 3 shows the outer shape (chip outer shape) of a region corresponding to a chip formed on a wafer. The present embodiment is similarly executed in other regions than the portion enclosed by thick line (same in other embodiments).

FIG. 4 is a plan view illustrating a specific configuration of a part of the shape defect inspection region 2.

In FIG. 4, reference numeral 4 is a region in which a laminated structure of a quartz substrate and a HT film exists (Qz/HT mixed region), 5 is a region in which a laminated structure of a quartz substrate and a Cr film exists (Qz/Cr mixed region), 6 is a region in which a laminated structure (tritone portion) of a quartz substrate, a Cr film and a HT film exists (three-gradation region), and 7 is a border line dividing the shape defect inspection region 2 into two regions.

The border line 7 is a line for dividing into two regions in the conventional reflection type inspection, that is, a region including noise source, and a region not including noise source.

In the present embodiment, the border line 7 is a line obtained by connecting the outermost circumference of the Qz/Cr mixed region 5, and the outer circumference of the region surrounded by the border line 7 is supposed to be rectangular. The number of border lines 7 is one.

The shape of the outer circumference of the region surrounded by the border line 7 is not limited to be rectangular. In addition, the number of border lines 7 may be two or more depending on the location or the number of three-gradation regions as noise source. Generally, the three-gradation region is often present in outer circumference portion of the pattern.

Back to FIG. 2, first, data relating to the border line 7 (border line data) is acquired by using the EB drawing data (step S5-1). In the present embodiment, (the outer circumference of the border line 7 is rectangular), the border line data is expressed as coordinates of mutually opposing two vertexes of the rectangular shape.

FIG. 4 shows one set of coordinates (XL, YL). The coordinates (XL, YL) are coordinates defined in a system of coordinates having origin (0, 0) in the center of the photo mask 1 when viewing the pattern (image) on the photo mask (quartz substrate/HT film/Cr film) 1 from the quartz substrate side. The system of coordinates is a system of coordinates on a layout determined by the EB drawing data.

Next, inspection control information is created based on the border line data (step S5-2). The inspection control information includes information about a region to be inspected in an ordinary inspection condition (region not including a three-gradation region) (ordinary inspection region information), and information about a region to be inspected in a noise-free condition (region including a three-gradation region) (tritone inspection region information)

The Tritone inspection region information includes information for specifying a range of the region to be inspected in the noise-free condition (region including a three-gradation region) (first range information). When the shape of the region is rectangular, the first range information is expressed by coordinates of mutually opposing two vertexes of the rectangular shape.

The ordinary inspection region information includes information for specifying a range of the region to be inspected in the ordinary condition (region not including a three-gradation region) (second range information). The second range information includes, for example, information for specifying a range excluding the region to be inspected in the noise-free condition from the entire inspection region (third information).

After step S5 (S5-1, S5-2), the inspection control information is added to the EB drawing data, and data relating to inspection and drawing of a photo mask (drawing and inspection data) is created (step S6). In the present embodiment, since an inspection data format and a drawing data format are common in format, it is easy to handle the drawing and inspection data.

Next, by using the drawing and inspection data obtained in step S6, the photo mask is inspected for shape defect in a die-to-database comparison system (step S7).

The photo mask is inspected in both transmission type and reflection type. The transmission type inspection is same as in the prior art, but the reflection type inspection is different from the prior art as explained below.

In the reflection type inspection of the present embodiment, on the basis of the ordinary inspection region information and tritone inspection region information in the drawing and inspection data, the region not including a three-gradation region is inspected in the ordinary inspection condition, and the region including a three-gradation region is inspected in a condition in which noise generated due to three gradations is not detected. That is, the region not including a three-gradation region and the region including a three-gradation region are inspected individually in appropriate conditions. The condition in which noise generated due to three gradations is not detected is, for example, a condition of lowering the inspection sensitivity than the ordinary inspection condition.

Figure 5:
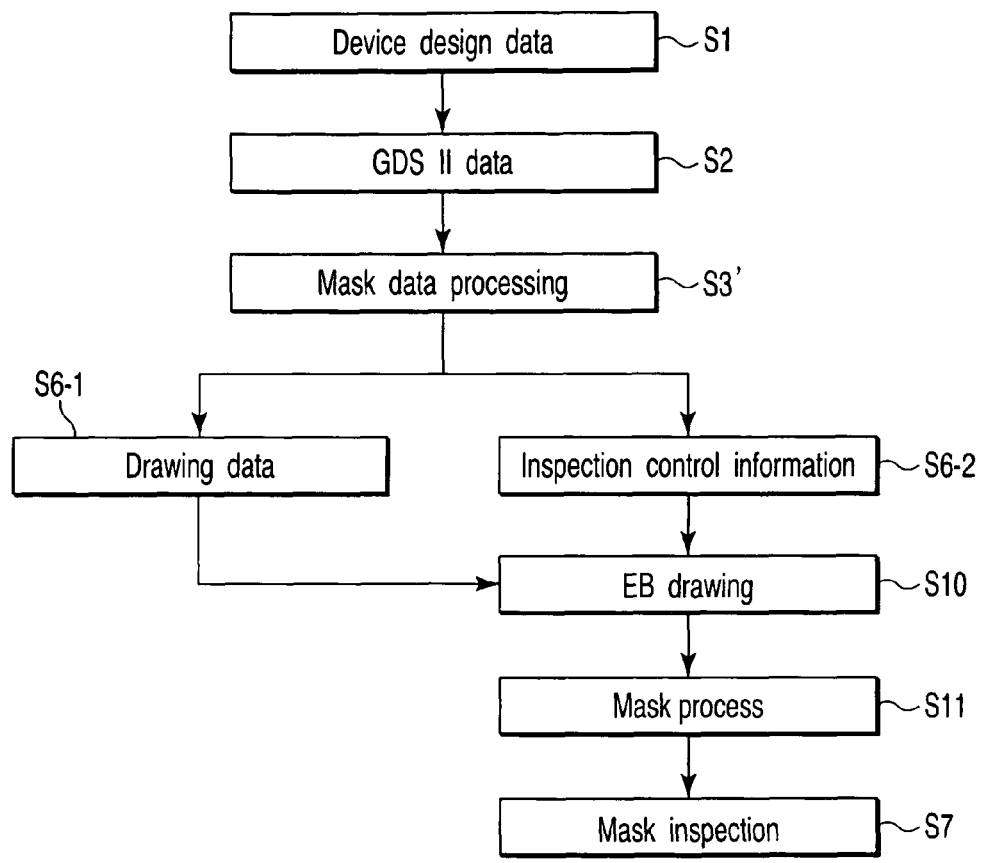
FIG. 5 is a flowchart showing a flow up to EB drawing in a method of manufacturing a photo mask in a prior art.
Figure 6:
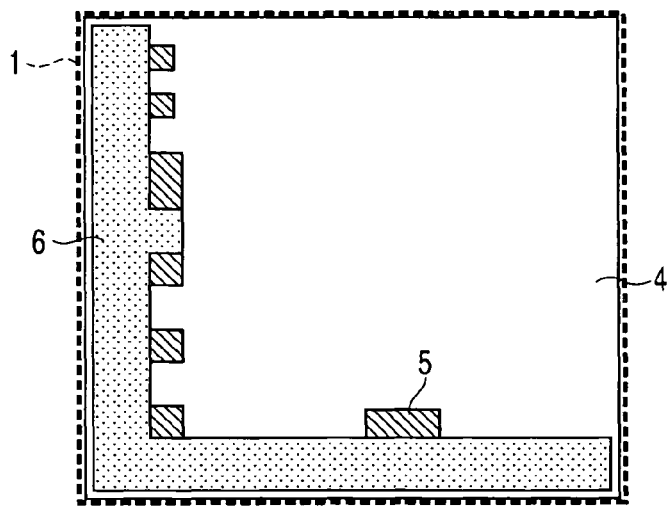
FIG. 6 is a plan view illustrating a specific configuration of a part of a shape defect inspection region in the photo mask in the prior art.

FIG. 5 is a flowchart showing a flow up to EB drawing of a method of manufacturing a photo mask in a prior art. FIG. 6 is a plan view illustrating a specific configuration of a part of a conventional shape defect inspection region 2. FIGS. 5 and 6 correspond to FIGS. 1 and 4 of the present embodiment, respectively.

In the prior art, as shown in FIG. 5, GDS II data undergoes mask data processing (step S3'), inspection control information and EB drawing data are created separately (steps S6-1, S6-2), and the inspection control information and EB drawing data are compiled in different formats individually. In the prior art, therefore, handling of the inspection control information and EB drawing data is complicated.

Further, in the prior art, as shown in FIG. 6, the inspection area is not divided into a region including a three-gradation region and a region not including a three-gradation region. Therefore, since the entire area of the inspection region is inspected by reflection type inspection in the ordinary inspection condition in the prior art, noise is detected in the region including a three-gradation region, and this noise may be recognized as defect.

If defect is detected as a result of inspecting a photo mask in step S7, the defect is corrected. Depending on the number of detected defects or the degree of defect (size), the photo mask may be abandoned.

Next, by using the drawing data among the drawing and inspection data, a pattern is drawn on a resist in a mask blank substrate by EB drawing apparatus. The mask blank substrate includes a quartz substrate, a light shielding film (Cr film used herein) formed on the quartz substrate, and a resist formed on the light shielding film. The pattern is a pattern corresponding to a light shielding film pattern.

Next, the resist is developed to form a resist pattern, the light shielding film is etched by using the resist pattern as a mask, and a light shielding film pattern is formed (step S8). Later, the resist pattern is removed.

Next, a HT film is formed on the entire surface of the quartz substrate and the light shielding film pattern, a resist is applied on the HT film, and by using the drawing data among the drawing and inspection data, a pattern is drawn on the resist by the EB apparatus. The pattern is a pattern corresponding to a HT film pattern.

Next, the resist is developed to form a resist pattern, the HT film is etched by using the resist pattern as a mask, and an HT film pattern is formed (step S9). Later, the resist pattern is removed.

After this process, a photo mask is obtained.

According to the present embodiment as described herein, the inspection region is divided into the region including the three-gradation region and the region not including the three-gradation region, and the region including the three-gradation region and the region not including the three-gradation region are inspected by reflection type inspection in proper inspection conditions, so that mask inspection at high precision is realized. Besides, since noise is not detected in the region including the three-gradation region, inspection is not stopped on the way, and mask inspection of high throughput is realized.

Second Embodiment

Figure 7:
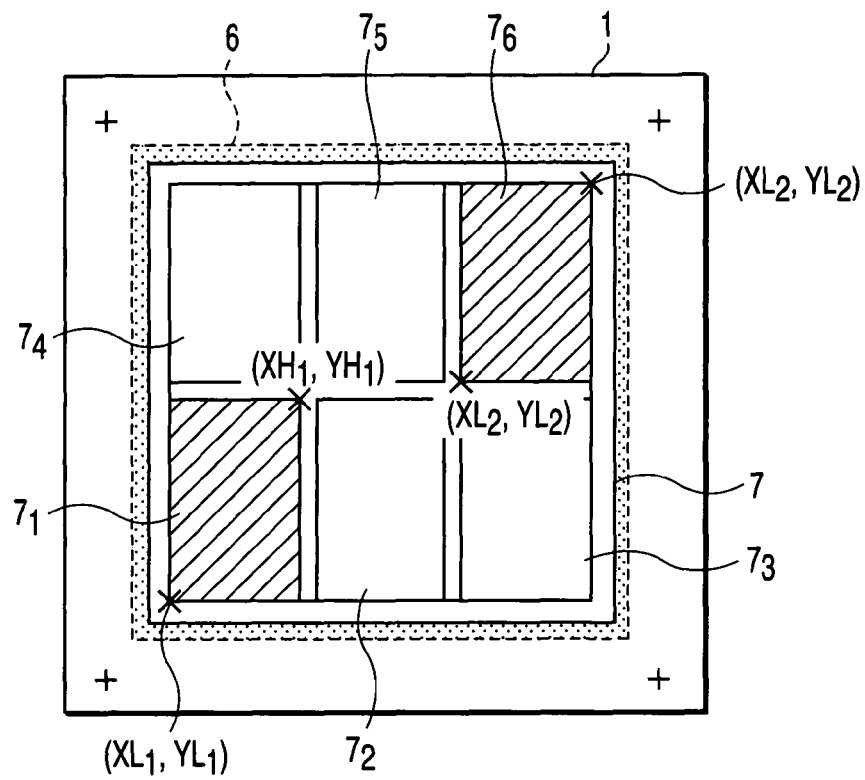
FIG. 7 is a plan view illustrating a shape defect inspection region in a photo mask according to the second embodiment of the invention.

FIG. 7 is a plan view illustrating a shape defect inspection region in a photo mask according to the second embodiment of the invention.

The present embodiment is different from the first embodiment in a point that a specific region of the shape defect inspection region 2 is inspected by the shape detect inspection apparatus of die-to-database comparison system.

The shape defect inspection region 2 includes the first to sixth regions $2_1$ to $2_6$. The first and sixth regions $2_1$, $2_6$ require die-to-database comparison system inspection, and the second to fifth regions $2_2$ to $2_5$ do not require die-to-database comparison system inspection.

Figure 8:
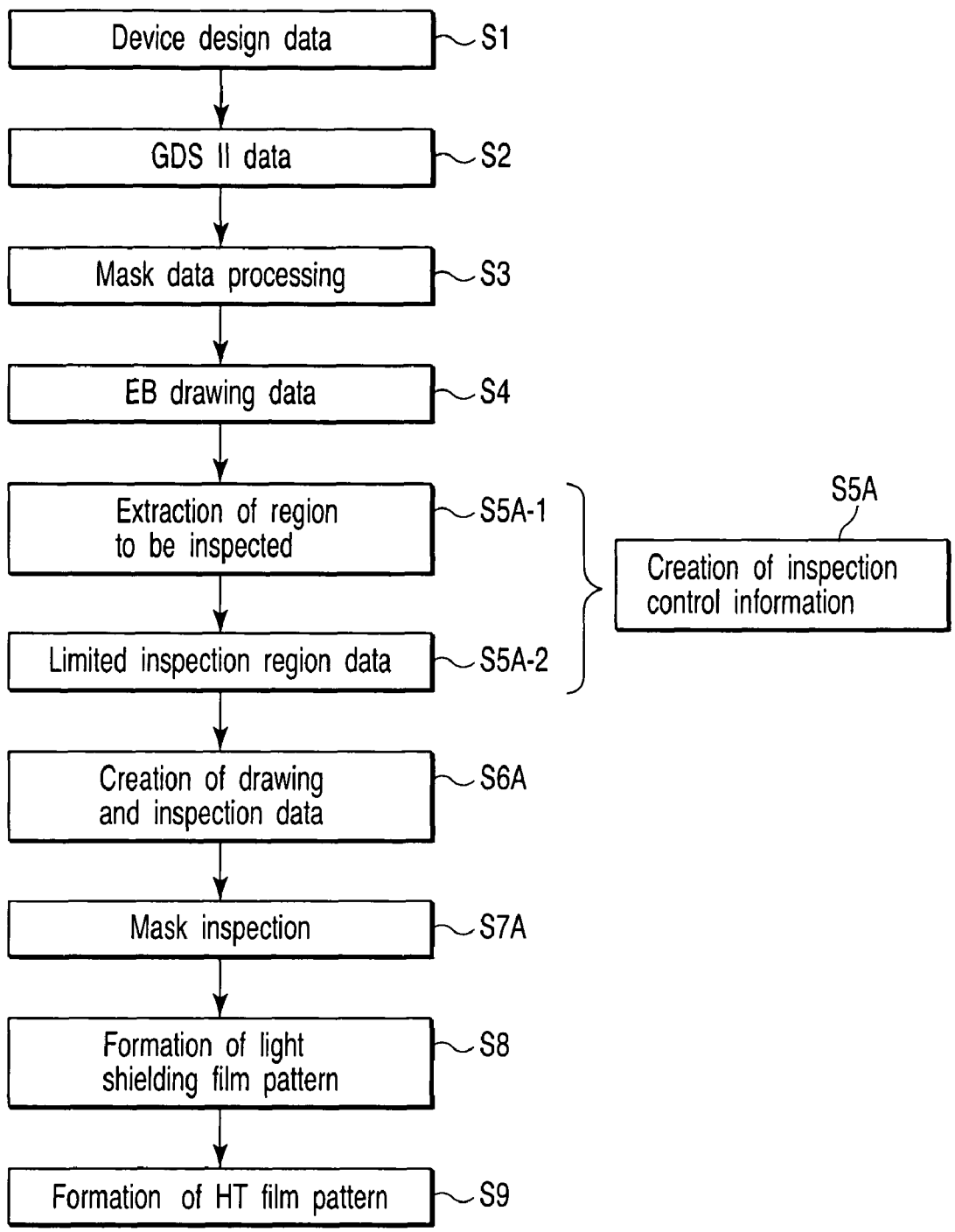
FIG. 8 is a flowchart showing a flow of a method of manufacturing a photo mask according to the second embodiment of the invention.

FIG. 8 is a flowchart showing a flow of a method of manufacturing a photo mask according to the present embodiment. Same parts corresponding to those in FIG. 1 are identified with same reference numerals, and specific description is omitted (same in the other embodiments).

According to the method of manufacturing the photo mask of the present embodiment, steps S1 to S4 are carried out in the same manner as in the first embodiment.

Next, the inspection control information is created by using the EB drawing data (step S5A).

Specifically, first, a region to be inspected is extracted from the first to sixth regions $2_1$ to $2_6$ on the basis of the EB drawing data (step S5A-1).

To determine whether or not a region is to be inspected, it is determined whether or not the minimum dimension in the pattern of the region is smaller than a predetermined value (threshold). In this case, a region including a pattern having a minimum dimension smaller than the threshold is a region to be inspected.

Thereafter, data (limited inspection region data) relating to the region extracted to be inspected (herein, regions $2_1$, $2_6$) is created as the inspection control information (step S5A-2).

In the case of the shape defect inspection region 2 in FIG. 7, the limited inspection region data is as shown in (1) to (4) below:

(1) (XL1, YL1): lower left coordinates of region $2_1$;
(2) (XH1, YH1): upper right coordinates of region $2_1$;
(3) (XL6, YL6): lower left coordinates of region $2_6$; and
(4) (XH6, YH6): upper right coordinates of region $2_6$.

These coordinates are defined in a system of coordinates supposing the center of the photo mask 1 to be origin (0, 0) when viewing the pattern (image) on the photo mask (quartz substrate/HT film/Cr film) 1 from the quartz substrate side. The system of coordinates is a system of coordinates on a layout determined by the EB drawing data.

By coordinates (XL1, YL1) and (XH1, YH1), mutually opposing two vertexes of the rectangular region $2_1$ are determined, and the range of the region $2_1$ is determined. Similarly, by coordinates (XL6, YL6) and (XH6, YH6), mutually opposing two vertexes of the rectangular region $2_6$ are determined, and the range of the region $2_6$ is determined.

After step S5A (S5A-1, S5A-2), inspection control information is added to the EB drawing data, and data about inspection and drawing of the photo mask (drawing and inspection data) is created (step S6A).

Next, by using the drawing and inspection data obtained in step S6A, the photo mask is inspected for shape defect by a die-to-database comparison system (step S7A).

In the reflection type inspection of the present embodiment, the regions corresponding to the limited inspection region data (regions $2_1$, $2_6$) are specified on the basis of the limited inspection region data among the drawing and inspection data, and only these regions (regions $2_1$, $2_6$) are inspected by the die-to-database comparison system, while other regions are not inspected by the die-to-database comparison system. Therefore, according to the present embodiment, useless inspection by the die-to-database comparison system is not executed, and waste is avoided, so that mask inspection of high throughput is realized.

As for the photo mask without a limited inspection region, the inside region of the pattern outer shape is inspected in the same manner as in the prior art.

Hereinafter, in the same manner as in the first embodiment, a light shielding film pattern is created (step S8) and a HT film pattern is created (step S9), so that a photo mask is obtained.

Third Embodiment

Figure 9:
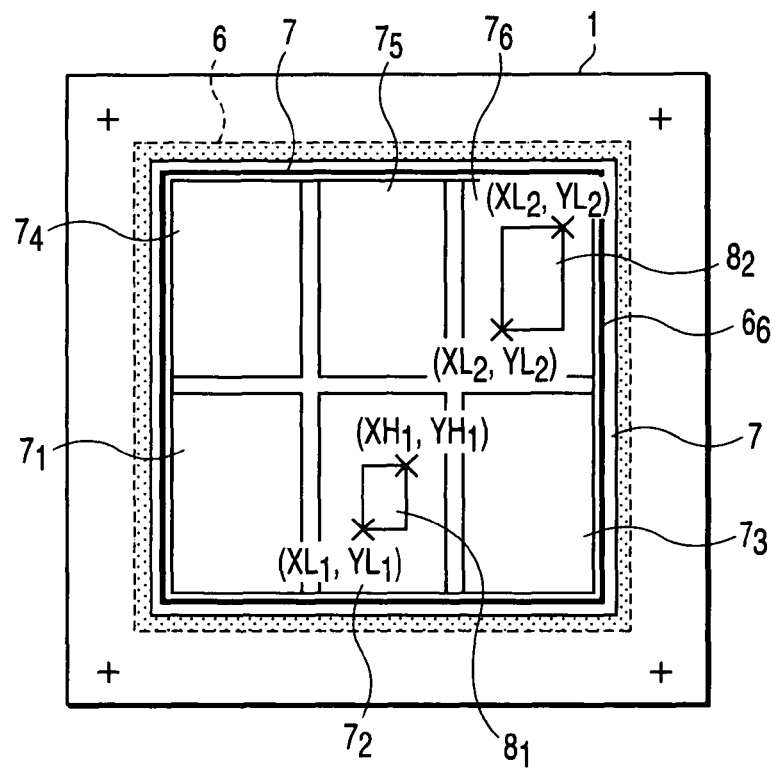
FIG. 9 is a plan view illustrating a shape defect inspection region in a photo mask according to the third embodiment of the invention.

FIG. 9 is a plan view illustrating a shape defect inspection region in a photo mask according to the third embodiment of the invention.

The present embodiment is different from the first embodiment in a point that a region excluding part of a region of a shape defect inspection region 2 (non-inspection region) is inspected by a shape detect inspection apparatus of die-to-database comparison system.

Specifically, when location of a pattern including noise source or a pattern including false defect source such as a fine OPC pattern existing in the shape defect inspection region 2, has been known preliminarily, the region including such patterns can be excluded from the inspection region before inspection.

In the case of the shape defect inspection region 2 in FIG. 9, regions $8_1$, $8_2$ out of the regions $2_2$, $2_6$ are regions excluded from the inspection regions. That is, the regions $8_1$, $8_2$ are regions including a false defect causing pattern or a noise causing pattern (sub-regions).

Figure 10:
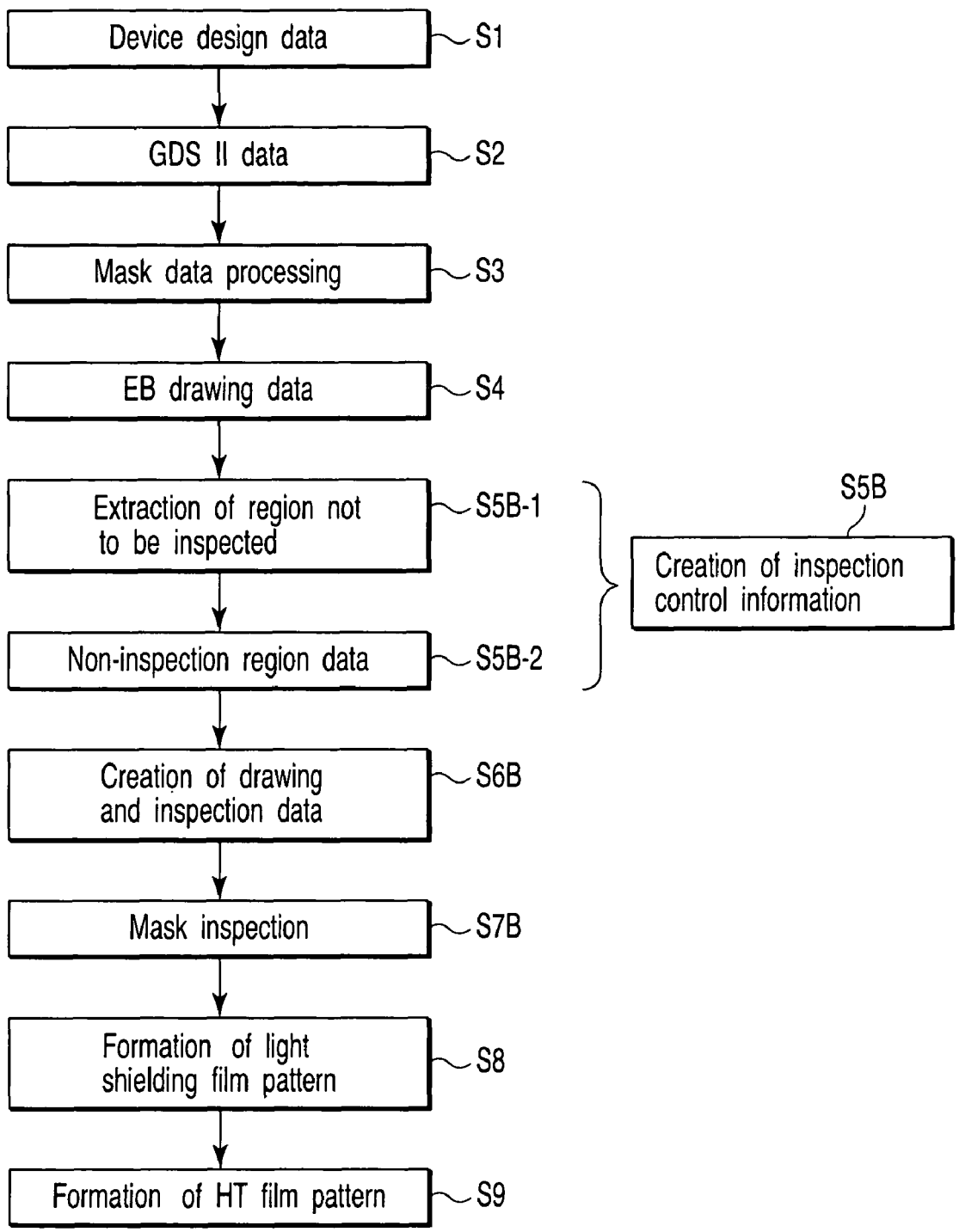
FIG. 10 is a flowchart showing a flow of a method of manufacturing a photo mask according to the third embodiment of the invention.

FIG. 10 is a flowchart showing a flow of a method of manufacturing a photo mask according to the present embodiment.

According to the method of manufacturing the photo mask of the present embodiment, steps S1 to S4 are carried out in the same manner as in the first embodiment.

Next, inspection control information is created by using the EB drawing data (step S5B).

Specifically, first, a region not to be inspected (non-inspection region) is extracted from the shape defect inspection region 2 on the basis of EB drawing data (step S5B-1).

To determine whether or not a region is to be inspected, it is determined whether or not the region includes a correction pattern, such as a pattern for OPC (OPC pattern), a pattern for process proximity correction (PPC) (PPC pattern), or OPC and PPC patterns. In this case, regions including OPC patterns or like that are non-inspection regions.

Thereafter, data about the non-inspection regions (herein, regions $8_1$, $8_2$) (non-inspection region data) is created as the inspection control information (step S5B-2).

In the case of the shape defect inspection region 2 in FIG. 9, the non-inspection region data is as shown in (1) to (4) below:

(1) (XL81, YL81): lower left coordinates of region $8_1$;
(2) (XH81, YH81): upper right coordinates of region $8_1$;
(3) (XL82, YL82): lower left coordinates of region $8_2$; and
(4) (XH82, YH82): upper right coordinates of region $8_2$.

These coordinates are defined in a system of coordinates supposing the center of the photo mask 1 to be origin (0, 0) when viewing the pattern (image) on the photo mask (quartz substrate/HT film/Cr film) 1 from the quartz substrate side. This system of coordinates is a system of coordinates on a layout determined by the EB drawing data.

By coordinates (XL81, YL81) and (XH81, YH81), mutually opposing two vertexes of the rectangular region $8_1$ are determined, and the range of the region $8_1$ is determined. Similarly, by coordinates (XL82, YL82) and (XH82, YH82), mutually opposing two vertexes of the rectangular region $8_2$ are determined, and the range of the region $8_2$ is determined.

After step S5B (S5B-1, S5B-2), inspection control information is added to the EB drawing data, and data about inspection and drawing of the photo mask (drawing and inspection data) is created (step S6B).

Next, by using the drawing and inspection data obtained in step S6B, the photo mask is inspected for shape defect by a die-to-database comparison system (step S7B).

In the reflection type inspection of the present embodiment, the regions corresponding to the non-inspection region data, that is, regions $8_1$, $8_2$ including false defect causes and the like are specified on the basis of the non-inspection region data among the drawing and inspection data, and these regions $8_1$, $8_2$ are not inspected. Therefore, according to the present embodiment, mask inspection of high precision and high throughput is realized.

As for the photo mask not including the non-inspection region, the inside region of the pattern outer shape is inspected in the same manner as in the prior art.

Hereinafter, in the same manner as in the first embodiment, a light shielding film pattern is created (step S8) and a HT film pattern is created (step S9), so that a photo mask is obtained.

Fourth Embodiment

Figure 11:
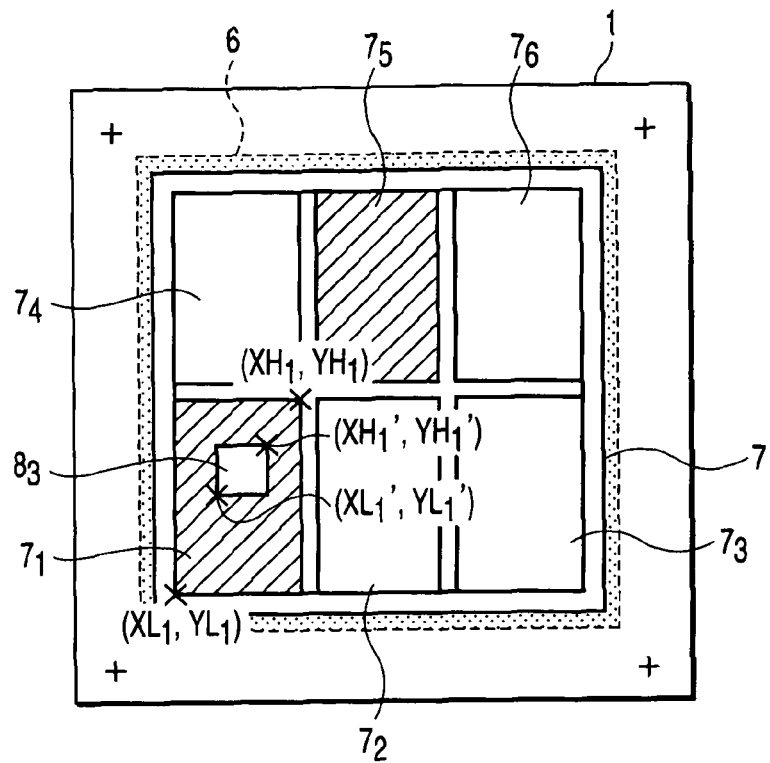
FIG. 11 is a plan view illustrating a shape defect inspection region in a photo mask according to the fourth embodiment of the invention.

FIG. 11 is a plan view illustrating a shape defect inspection region in a photo mask according to the fourth embodiment of the invention.

The present embodiment is different from the first embodiment in a point that specific regions out of a shape defect inspection region 2 (region $2_1$ to $2_6$) are inspected by a shape detect inspection apparatus of die-to-database comparison system, and that, if locations false defect causing patterns such as OPC patterns or noise causing patters are known out of the specific regions, regions including such patterns are removed from inspection regions before starting inspection.

That is, the present embodiment is a combination of the second and third embodiments.

Figure 12:
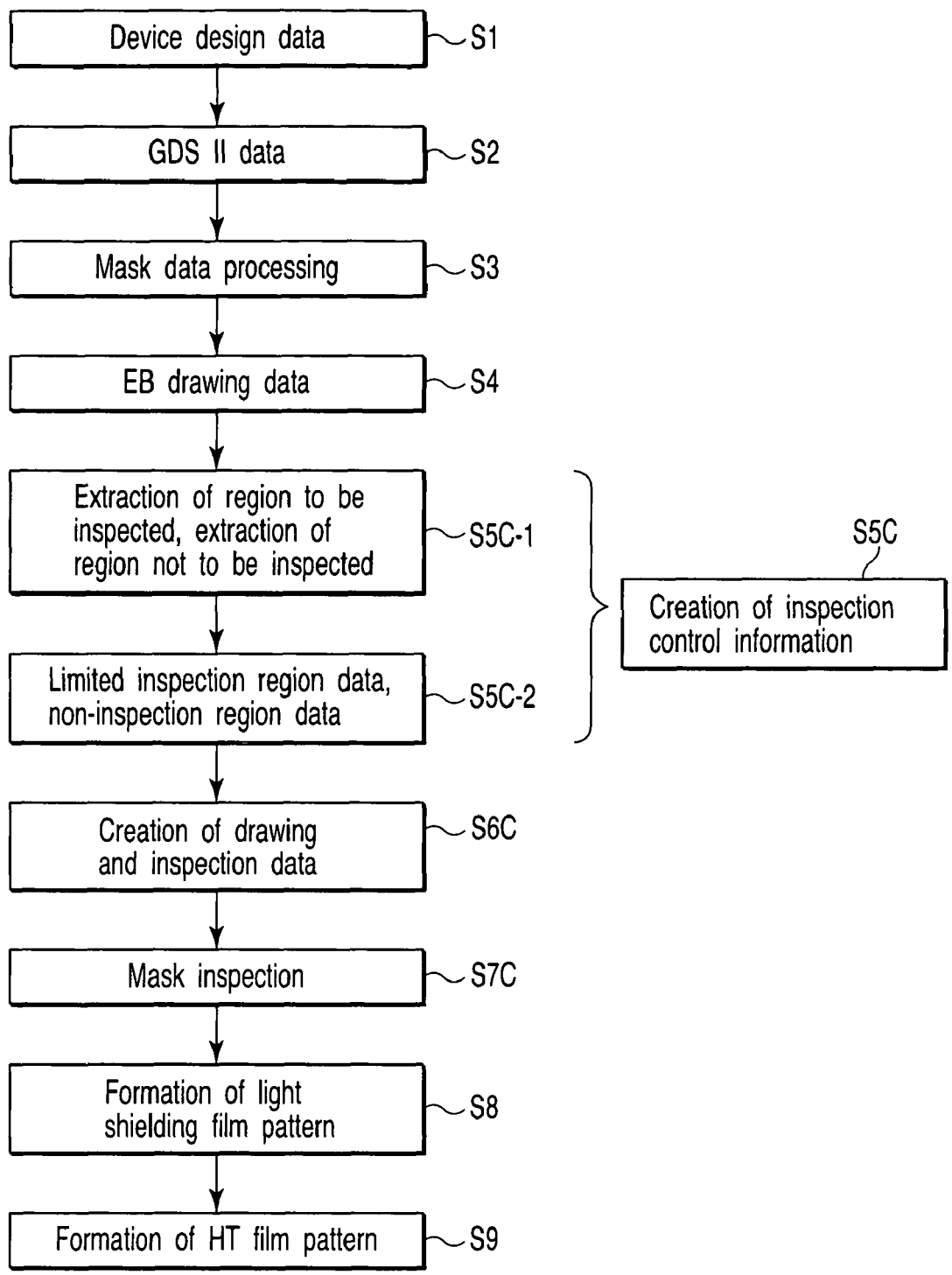
FIG. 12 is a flowchart showing a flow of a method of manufacturing a photo mask according to the fourth embodiment of the invention.

FIG. 12 is a flowchart showing a flow of a method of manufacturing a photo mask according to the present embodiment.

According to the method of manufacturing the photo mask of the present embodiment, steps S1 to S4 are carried out in the same manner as in the first embodiment.

Next, inspection control information is created by using the EB drawing data (step S5C).

Specifically, the steps S5A-1, S5A-2 in the second embodiment, and the steps S5B-1, S5B-2 in the third embodiment are executed, and limited inspection region data and non-inspection region data are created (steps S5C-1, S5C-2).

After step S5C (S5C-1, S5C-2), inspection control information is added to the EB drawing data, and data about inspection and drawing of the photo mask (drawing and inspection data) is created (step S6C).

Next, by using the drawing and inspection data obtained in step S6C, the photo mask is inspected for shape defect by a die-to-database comparison system (step S7C). Therefore, according to the present embodiment, mask inspection of high precision and high throughput is realized.

Hereinafter, in the same manner as in the first embodiment, a light shielding film pattern is created (step S8) and a HT film pattern is created (step S9), so that a photo mask is obtained.

Fifth Embodiment

Figure 13:
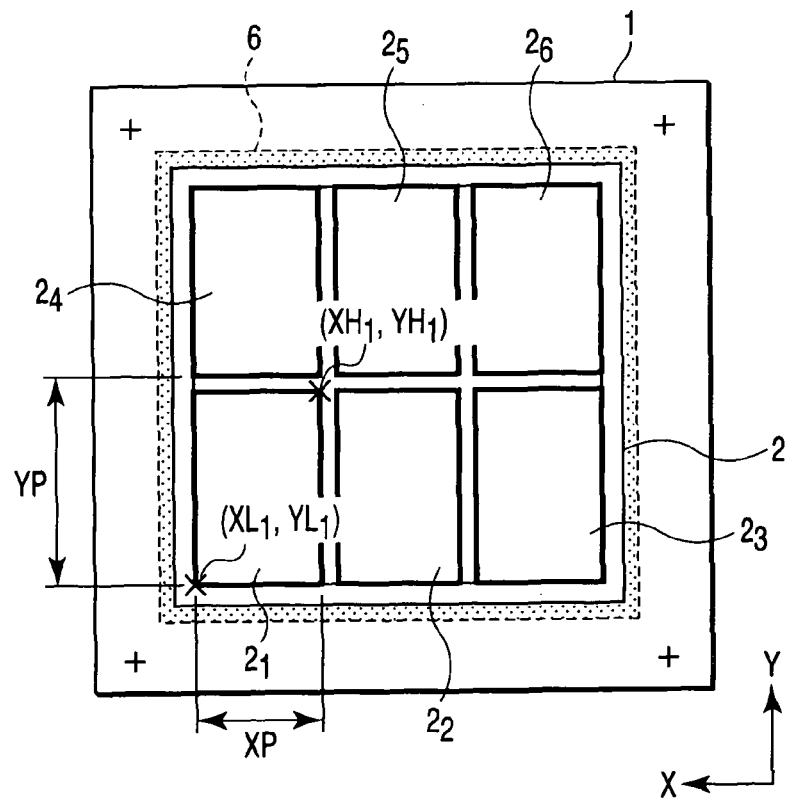
FIG. 13 is a plan view illustrating a shape defect inspection region in a photo mask according to the fifth embodiment of the invention.

FIG. 13 is a plan view illustrating a shape defect inspection region in a photo mask according to the fifth embodiment of the invention. In a shape defect inspection region $2$, regions $2_1$ to $2_6$ are regularly disposed, repeatedly.

Figure 14:
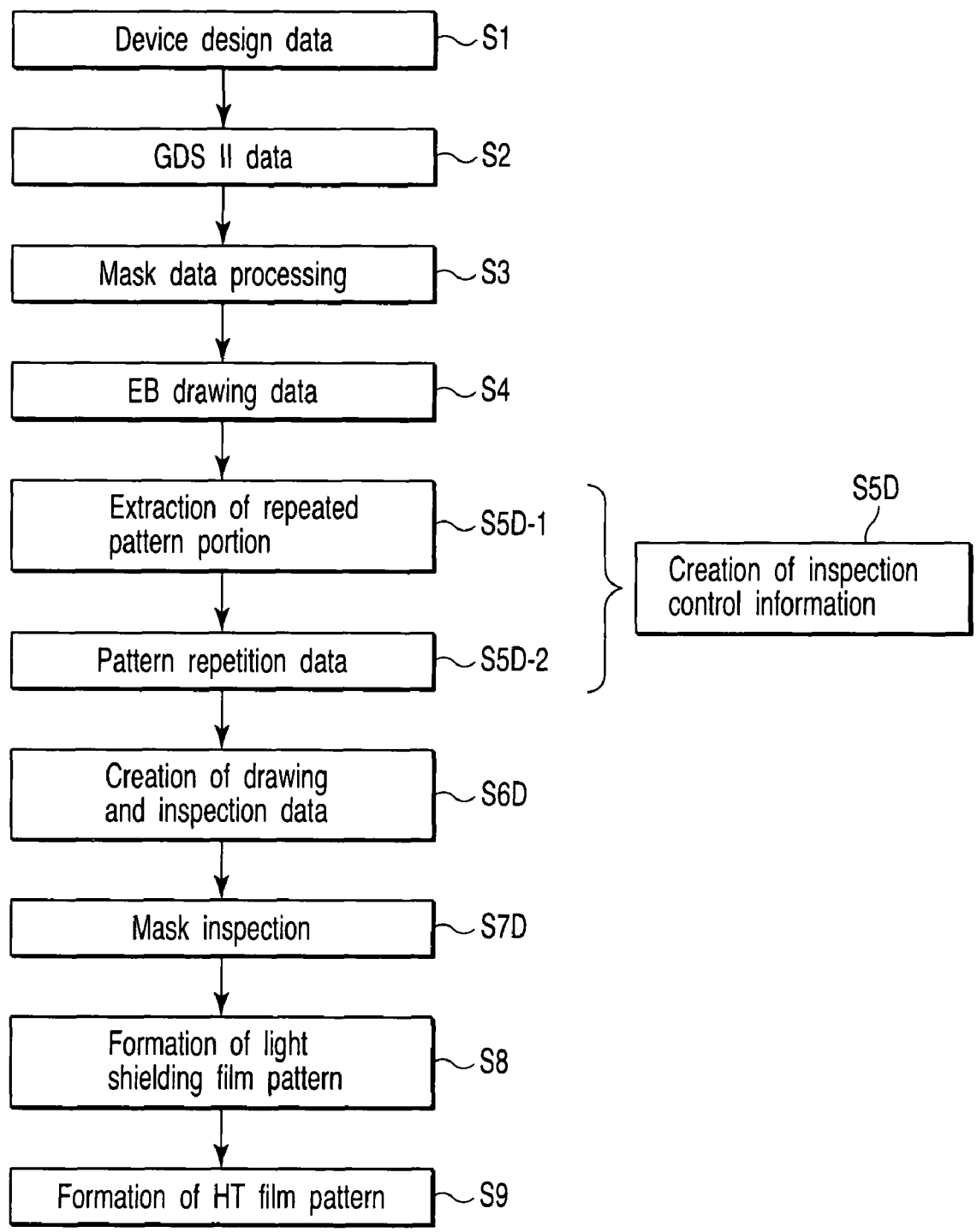
FIG. 14 is a flowchart showing a flow of a method of manufacturing a photo mask according to the fifth embodiment of the invention.

FIG. 14 is a flowchart showing a flow of a method of manufacturing a photo mask according to the present embodiment.

According to the method of manufacturing the photo mask of the present embodiment, steps S1 to S4 are carried out in the same manner as in the first embodiment.

Then, inspection control information is created by using the EB drawing data (step S5D).

Specifically, on the basis of the EB drawing data, regions including the same pattern and disposed regularly and repeatedly (repeated pattern portions) are extracted (step S5D-1). Herein, the repeated pattern positions are the regions $2_1$ to $2_6$.

Data about positions of the regions $2_1$ to $2_6$ (pattern repetition data) is created (step S5D-2).

In the case of the shape defect inspection region 2 in FIG. 14, the pattern repetition data is as shown in (1) to (6) below:
(1) XN: the number of regions disposed repeatedly in the X-direction, and including the same pattern (=3);
(2) YN: the number of regions disposed repeatedly in the Y-direction, and including the same pattern (=2);
(3) XP: pitch of regions disposed repeatedly in the X-direction, and including the same pattern (X-direction pattern array pitch);
(4) YP: pitch of regions disposed repeatedly in the Y-direction, and including the same pattern (Y-direction pattern array pitch);
(5) (XL, YL): lower left coordinates of the region $2_1$ (lower left coordinates of a reference pattern for use in die-to-die system inspection); and
(6) (XH, YH): upper right coordinates of the region $2_1$ (upper right coordinates of a reference pattern for use in die-to-die system inspection).

These coordinates (YL, YL) and (XH, YH) are coordinates defined in a system of coordinates supposing the center of the photo mask 1 to be origin (0, 0) when viewing the pattern (image) on the photo mask (quartz substrate/HT film/Cr film) 1 from the quartz substrate side. This system of coordinates is a system of coordinates on a layout determined by the EB drawing data.

After step S5D (S5D-1, S5D-2), inspection control information is added to the EB drawing data, and data about inspection and drawing of the photo mask 1 (drawing and inspection data) is created (step S6D).

Next, by using the drawing and inspection data obtained in step S6D, the photo mask 1 is inspected for shape defect by a die-to-database and die-to-die system (step S7D).

In the present embodiment, the photo mask 1 is first inspected for shape defect by a die-to-database system. At this time, the region $2_1$ is inspected on the basis of (XL, YL) and (XH, YH) in the inspection control information in the drawing and inspection data.

Next, the photo mask 1 is inspected for shape defect by the die-to-die system. At this time, on the basis of (XL, YL) and (XH, YH) in the inspection control information in the drawing and inspection data, the region $2_1$ is selected as a reference pattern for use in shape defect inspection by the die-to-die system. Further, on the basis of XN, YN, XP, and YP in the inspection control information in the drawing and inspection data, the regions $2_2$ to $2_6$ are inspected for shape defect by the die-to-die system.

Inspection regions other than the repetition pattern portion are inspected for defect by the die-to-database system.

Hereinafter, in the same manner as in the first embodiment, a light shielding film pattern is created (step S8) and a HT film pattern is created (step S9), so that a photo mask is obtained.

A method of manufacturing a semiconductor device according to an embodiment will be explained.

The method of manufacturing a semiconductor device according to the present embodiment is a method of manufacturing a semiconductor device by using a photo mask manufactured in any one of the methods explained in the foregoing embodiments. A specific procedure is as follows.

First, a resist film is applied on a substrate including a semiconductor substrate. The semiconductor substrate is, for example, a silicon substrate or a SOI substrate.

Next, by using a charged beam drawing apparatus, a pattern is drawn on the resist film. Thereafter, by developing the resist film, a resist pattern is formed.

Next, by using the resist pattern as mask, the substrate is etched, and a pattern is formed on the substrate.

Herein, in the case where an underlying layer (uppermost layer of substrate) of the resist layer is a polysilicon film or a metal film, an electrode pattern or a wiring pattern is formed.

In the case where the underlying layer of the resist is an insulating film, a fine contact hole pattern or a gate insulating film is formed.

In the case where the underlying layer of the resist is a semiconductor substrate, an isolation trench (STI) or the like is formed.

The present invention is not limited to the above described embodiments. For example, in the above embodiments, EB exposure is explained, but the present invention can be also applicable in the case of exposure using ion beam or the like. The type of the light shielding film, the type of the HT film, or wavelength of the light source to be used are not particularly limited.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a photo mask, the photo mask comprising a transparent substrate which transmits light, a light shielding pattern provided on the transparent substrate and shielding the light, and a translucent pattern provided on a region including a part of the light shielding pattern and transmitting part of the light, the method comprising:

creating photo mask data including drawing and inspection data by a method of creating photo mask data, wherein the method of creating photo mask data comprises:

preparing design data of the photo mask;

generating drawing data of the photo mask by using the design data;

generating inspection control information configured to control inspection of defects on the photo mask by using the drawing data, the inspection control information corn rising information for inspecting a part of an inspection region on the photo mask in a different manner from other regions of the inspection region; and generating an item of drawing and inspection data representing the drawing data and the inspection control information by providing the drawing data with the inspection control information;

forming a pattern including a light shielding pattern and a translucent pattern on a transparent substrate, on a basis of the drawing and inspection data; and inspecting the pattern on the basis of the drawing and inspection data by reflection-type inspection, wherein:

generating the inspection control information includes generating a first range information and a first inspection sensitivity relating to a range of a region including a laminated structure formed by laminating the transparent substrate the light shielding pattern and the translucent pattern, and a second range information and a second inspection sensitivity lower than the first inspection sensitivity relating to a range of a region not including the laminated structure, on a basis of the drawing data; and generating the drawing and in section data includes providing the drawing data with the first range information, the first inspection sensitivity, the second range information, and the second inspection sensitivity.

2. The method of manufacturing a photo mask, according to claim 1, further comprising:

determining a photo mask including the pattern acceptable in a case where the pattern passes the inspecting.

3. A method of manufacturing a semiconductor device comprising:

preparing a photo mask determined acceptable by a method of manufacturing a photo mask according to claim 2; and manufacturing a semiconductor device by using the photo mask.

4. The method of manufacturing a photo mask, according to claim 1, wherein the reflection-type inspection is performed by die-to-database comparison system.

* * * * *

UNITED STATES PATENT AND TRADEMARK OFFICE
CERTIFICATE OF CORRECTION

PATENT NO. : 7,735,055 B2 Page 1 of 1
APPLICATION NO. : 11/187003
DATED : June 8, 2010
INVENTOR(S) : Tsutsui et al.

It is certified that error appears in the above-identified patent and that said Letters Patent is hereby corrected as shown below:

Claim 1, column 11, lines 14-15, between "the method" and "of creating" delete the line break.

Claim 1, column 11, line 22, change "corn rising" to --comprising--.

Claim 1, column 12, line 7, change "substrate the" to --substrate, the--.

Claim 1, column 12, line 13, change "in section data" to --inspection data--.

Signed and Sealed this

Seventeenth Day of August, 2010

David J. Kappos
*Director of the United States Patent and Trademark Office*